United States Patent
Worley et al.

(10) Patent No.: US 10,298,010 B2
(45) Date of Patent: May 21, 2019

(54) ELECTROSTATIC DISCHARGE (ESD) ISOLATED INPUT/OUTPUT (I/O) CIRCUITS

(71) Applicant: QUALCOMM Incorporated, San Diego, CA (US)

(72) Inventors: Eugene Robert Worley, Irvine, CA (US); Reza Jalilizeinali, Carlsbad, CA (US); Sreeker Dundigal, San Diego, CA (US); Wen-Yi Chen, San Diego, CA (US); Krishna Chaitanya Chillara, San Diego, CA (US); Taeghyun Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 408 days.

(21) Appl. No.: 15/088,035

(22) Filed: Mar. 31, 2016

(65) Prior Publication Data

US 2017/0288398 A1    Oct. 5, 2017

(51) Int. Cl.
  *H02H 9/04*      (2006.01)
  *H03M 9/00*      (2006.01)
  *H03K 19/0185*   (2006.01)
  *H03K 19/003*    (2006.01)

(52) U.S. Cl.
  CPC ....... *H02H 9/046* (2013.01); *H03K 19/00315* (2013.01); *H03K 19/018528* (2013.01); *H03K 19/018592* (2013.01); *H03M 9/00* (2013.01)

(58) Field of Classification Search
  CPC ............ H02H 9/046; H03K 19/00315; H03K 19/018528; H03K 19/018592; H03M 9/00
  See application file for complete search history.

(56) References Cited

U.S. PATENT DOCUMENTS

| | | | |
|---|---|---|---|
| 6,552,583 B1 | 4/2003 | Kwong | |
| 6,624,992 B1 | 9/2003 | Aparin | |
| 6,785,109 B1 | 8/2004 | Huang et al. | |
| 7,869,174 B2 | 1/2011 | Tanaka et al. | |
| 8,339,757 B2 * | 12/2012 | Tsai | H02H 9/046 361/111 |
| 8,760,828 B2 | 6/2014 | Ma | |
| 2005/0258875 A1 * | 11/2005 | Wang | H03K 19/01852 327/108 |
| 2008/0055805 A1 | 3/2008 | Pong et al. | |

(Continued)

FOREIGN PATENT DOCUMENTS

EP    0482336 A1    4/1992

OTHER PUBLICATIONS

International Search Report and Written Opinion—PCT/US2017/014949—ISA/EPO—dated Apr. 19, 2017.

*Primary Examiner* — Scott Bauer
(74) *Attorney, Agent, or Firm* — Qualcomm Incorporated/Seyfarth Shaw LLP

(57) ABSTRACT

A method of protecting a serializer/deserializer (SERDES) differential input/output (I/O) circuit includes detecting an electrostatic discharge event. The method also includes selectively disengaging a power supply terminal from a pair of I/O transistors of the SERDES differential I/O circuit in response to the detected electrostatic discharge event. The method further includes selectively disengaging a ground terminal from the pair of I/O transistors of the SERDES differential I/O circuit in response to the detected electrostatic discharge event.

24 Claims, 8 Drawing Sheets

(56) References Cited

U.S. PATENT DOCUMENTS

| | | | |
|---|---|---|---|
| 2010/0128407 A1* | 5/2010 | Maggiolino | H02H 9/04 |
| | | | 361/119 |
| 2010/0308888 A1* | 12/2010 | Kubo | H03K 19/01852 |
| | | | 327/333 |
| 2012/0307408 A1* | 12/2012 | Tanaka | H01L 27/0251 |
| | | | 361/56 |
| 2013/0010266 A1* | 1/2013 | Olsen | H04N 9/3144 |
| | | | 353/52 |
| 2013/0094549 A1* | 4/2013 | Ridel | H04L 27/00 |
| | | | 375/222 |
| 2013/0335099 A1 | 12/2013 | Di et al. | |

* cited by examiner

ELECTROSTATIC DISCHARGE (ESD) ISOLATED INPUT/OUTPUT (I/O) CIRCUITS

TECHNICAL FIELD

The present disclosure generally relates to integrated circuits (ICs). More specifically, the present disclosure relates to electrostatic discharge (ESD) isolated input/output (I/O) circuits.

BACKGROUND

Protection against electrostatic discharge (ESD) in electronic devices is generally performed using clamp circuits. These clamp circuits may be used to fix or "clamp" the positive or negative peak variations of a voltage signal to a defined value by shunting the ESD current. The timing elements of transient clamp circuits may be implemented by using resistors and capacitors (RC). Such clamp circuits are referred to as RC clamps. RC clamps may use the human body model (HBM) and the charged device model (CDM) to determine their RC time constant values. In addition, RC clamps have a number of advantages over other types of clamps including process portability, ease of simulation with standard metal oxide semiconductor field effect transistor (MOSFET) models, faster response times and lower conduction offset voltages.

As process technology continues to downscale, however, an ESD failure voltage scales down as well. For example, the failure voltages using the charged device model CDM test for ESD stressing may result in failure voltages as low as 3 volts for most advanced processes. One common method for ESD protection is using a diode in combination with an RC clamp. This approach exhibits a relatively low conduction offset voltage of about 1.6 volts, which is the sum of the diode and RC clamp offset voltages.

Unfortunately, the total offset voltage scales downward very slowly because about 1.1 volts of the total offset voltage is controlled by diode physics, which does not scale, while the RC clamp offset voltage scales very slowly because it is MOSFET threshold voltage dependent. When a protected MOSFET fails at 3 volts, this results in a very small voltage overhead for voltage (IR) drops of only 1.4 volts. If the peak CDM current is 5 amps (A), then the maximum total resistance for this case is 0.28 ohms (Ω). Thus, the sum of a diode "on" resistance, a bus resistance, and a RC clamp resistance should sum to less than 0.28 ohms. Those skilled in the art will recognize achieving the noted resistance sum is very challenging.

SUMMARY

An electrostatic discharge (ESD) protected serializer/deserializer (SERDES) differential driver circuit may include an input/output (I/O) driver. The I/O driver circuit may include a first transistor driver and a second transistor driver, each having a drain coupled to a differential output pad. The ESD protected SERDES differential driver circuit may also include a pre-driver circuit. The pre-driver circuit may include a first pre-driver inverter coupled to a gate of the first transistor driver. The pre-driver circuit may also include a second pre-driver inverter coupled to a gate of the second transistor driver. The pre-driver circuit may be selectively coupled between a power supply terminal and a ground terminal. The ESD protected SERDES differential driver circuit may also include a switch transistor selectively coupled between the power supply terminal, the first transistor driver, and the second transistor driver of the I/O driver circuit. The ESD protected SERDES differential driver circuit may further include a common mode transistor selectively coupled between the ground terminal, the first transistor driver and the second transistor driver of the I/O driver circuit. The ESD protected SERDES differential driver circuit may also include an ESD detector circuit configured to selectively disengage the power supply terminal from the first transistor driver and the second transistor driver of the I/O driver circuit, and configured to selectively disengage the ground terminal from the first transistor driver and the second transistor driver of the I/O driver circuit.

An electrostatic discharge (ESD) protected serializer/deserializer (SERDES) differential receiver circuit may include an input/output (I/O) receiver circuit. The I/O differential receiver circuit may include a first transistor receiver and a second transistor receiver, each have having a gate coupled to a differential input pad, and a drain coupled to an internal differential output. The ESD protected SERDES differential receiver circuit may also include a first load transistor selectively coupled between a power supply terminal and the first transistor receiver, and a second load transistor selectively coupled between the power supply terminal and the second transistor receiver of the I/O receiver circuit. The ESD protected SERDES differential receiver circuit may further include a common mode transistor selectively coupled between a ground terminal, the first transistor receiver and the second transistor receiver of the I/O receiver circuit. The ESD protected SERDES differential receiver circuit may also include an ESD detector circuit configured to selectively disengage the power supply terminal from the first transistor receiver and the second transistor receiver of the I/O receiver circuit, and configured to selectively disengage the ground terminal from the first transistor receiver and the second transistor receiver of the I/O receiver circuit.

A method of protecting a serializer/deserializer (SERDES) differential input/output (I/O) circuit includes detecting an electrostatic discharge event. The method also includes selectively disengaging a power supply terminal from a pair of I/O transistors of the SERDES differential I/O circuit in response to the detected electrostatic discharge event. The method further includes selectively disengaging a ground terminal from the pair of I/O transistors of the SERDES differential I/O circuit in response to the detected electrostatic discharge event.

An electrostatic discharge (ESD) protected serializer/deserializer (SERDES) differential driver circuit may include an input/output (I/O) driver. The I/O driver circuit may include a first transistor driver and a second transistor driver, each having a drain coupled to a differential output pad. The ESD protected SERDES differential driver circuit may also include a pre-driver circuit. The pre-driver circuit may include a first pre-driver inverter coupled to a gate of the first transistor driver. The pre-driver circuit may also include a second pre-driver inverter coupled to a gate of the second transistor driver. The pre-driver circuit may be selectively coupled between a power supply terminal and a ground terminal. The ESD protected SERDES differential driver circuit may also include a switch transistor selectively coupled between the power supply terminal, the first transistor driver, and the second transistor driver of the I/O driver circuit. The ESD protected SERDES differential driver circuit may further include a common mode transistor selectively coupled between the ground terminal, the first transistor driver and the second transistor driver of the I/O driver circuit. The ESD protected SERDES differential driver circuit may also include means for selectively disengaging the power supply terminal from the first transistor driver and the second transistor driver of the I/O driver circuit, and means for selectively disengaging the ground terminal from the first transistor driver and the second transistor driver of the I/O driver circuit.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
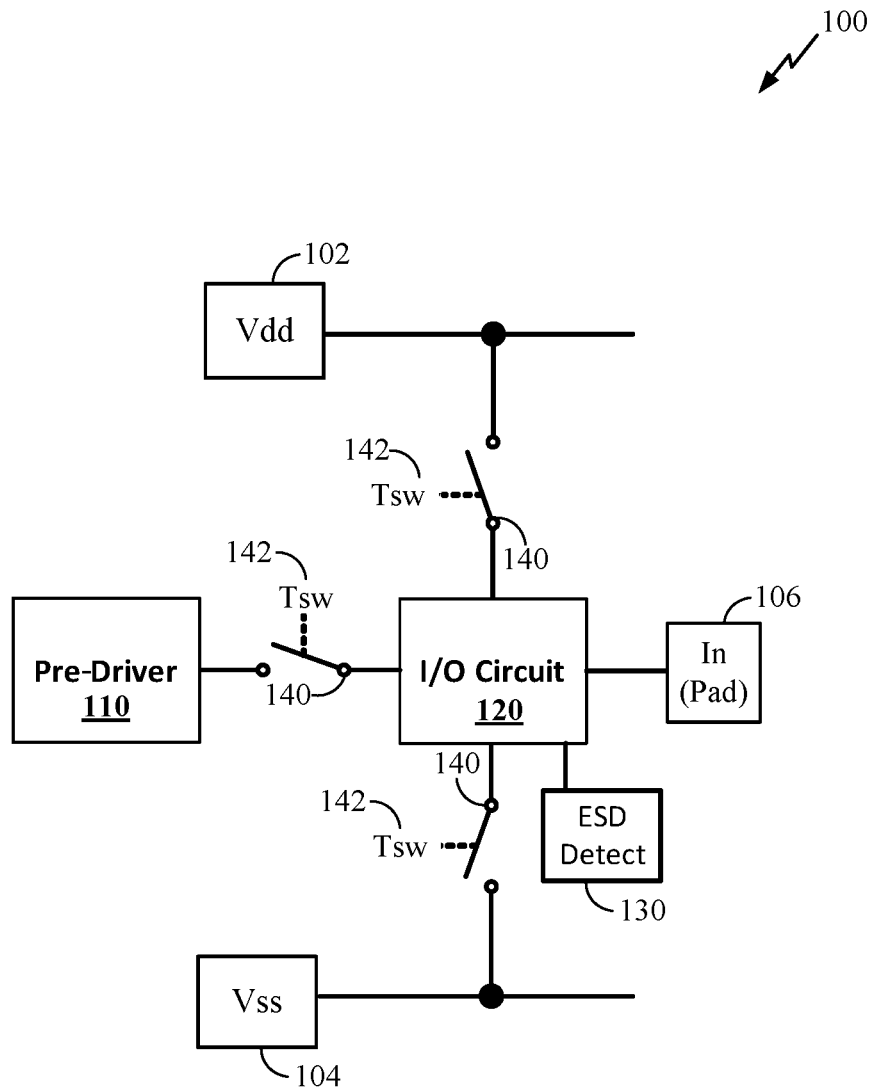
FIG. 1 is a schematic diagram of an ESD protected input/output (I/O) circuit system according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Protection against electrostatic discharge (ESD) in electronic devices may be performed using clamp circuits. These clamp circuits are used to shunt the ESD current by fixing or "clamping" the positive or negative peak variations of a voltage signal to a defined value. Resistors and capacitors (RC) are generally used to implement the timing elements of transient clamp circuits. Such clamp circuits are referred to as RC clamps. RC clamps may use the human body model (HBM) or the charged device model (CDM) to determine their RC time constant values. These RC clamps also have a number of advantages over other types of clamps including process portability, ease of simulation with standard metal oxide semiconductor field effect transistor (MOSFET) models, faster response times, as well as lower conduction offset voltages.

Low voltage (LV) core transistors are commonly used in input/output (I/O) circuits to provide both power and high data speeds. As process technology continues to downscale the low voltage core transistors, however, the electrostatic discharge failure voltage scales down as well. For example, failure voltages using the charged device model CDM test for electrostatic discharge stressing may result in failure voltages as low as 3 volts for most advanced processes. One common method for ESD protection of I/O circuits is using a diode in combination with an RC clamp. This approach exhibits a relatively low conduction offset voltage of about 1.6 volts, which is the sum of the diode and RC clamp offset voltages.

Unfortunately, the total offset voltage scales downward very slowly because about 1.1 volts of the total offset voltage is controlled by diode physics, which does not scale, while the RC clamp offset voltage scales very slowly because it is MOSFET threshold voltage dependent. When a protected MOSFET fails at 3 volts, a very small voltage overhead results for voltage (IR) drops of only 1.4 volts. If the peak CDM current is 5 amps (A), then the maximum total resistance for this is case is 0.28 ohms ($\Omega$). Thus, the sum of a diode "on" resistance, a bus resistance, and a RC clamp resistance should sum to less than 0.28 ohms. Those skilled in the art will recognize achieving the noted resistance sum is very challenging.

In one aspect of the disclosure, an ESD protected serializer/deserializer (SERDES) input/output (I/O) circuit is described in which the failure voltages are boosted to overcome the noted reduced offset voltage overhead. That is, because there is no obvious way to lower the offset voltage, which is limited by the noted physical properties, one solution, according to aspects of the present disclosure, relies on boosting the failure voltage of the SERDES I/O circuits. For example, if the I/O failure voltage can be increased to 5 volts, then the allowable maximum resistance associated with the discharge IR drop goes from 0.28 ohms to 0.68 ohms according to the example provided above.

Figure 3:
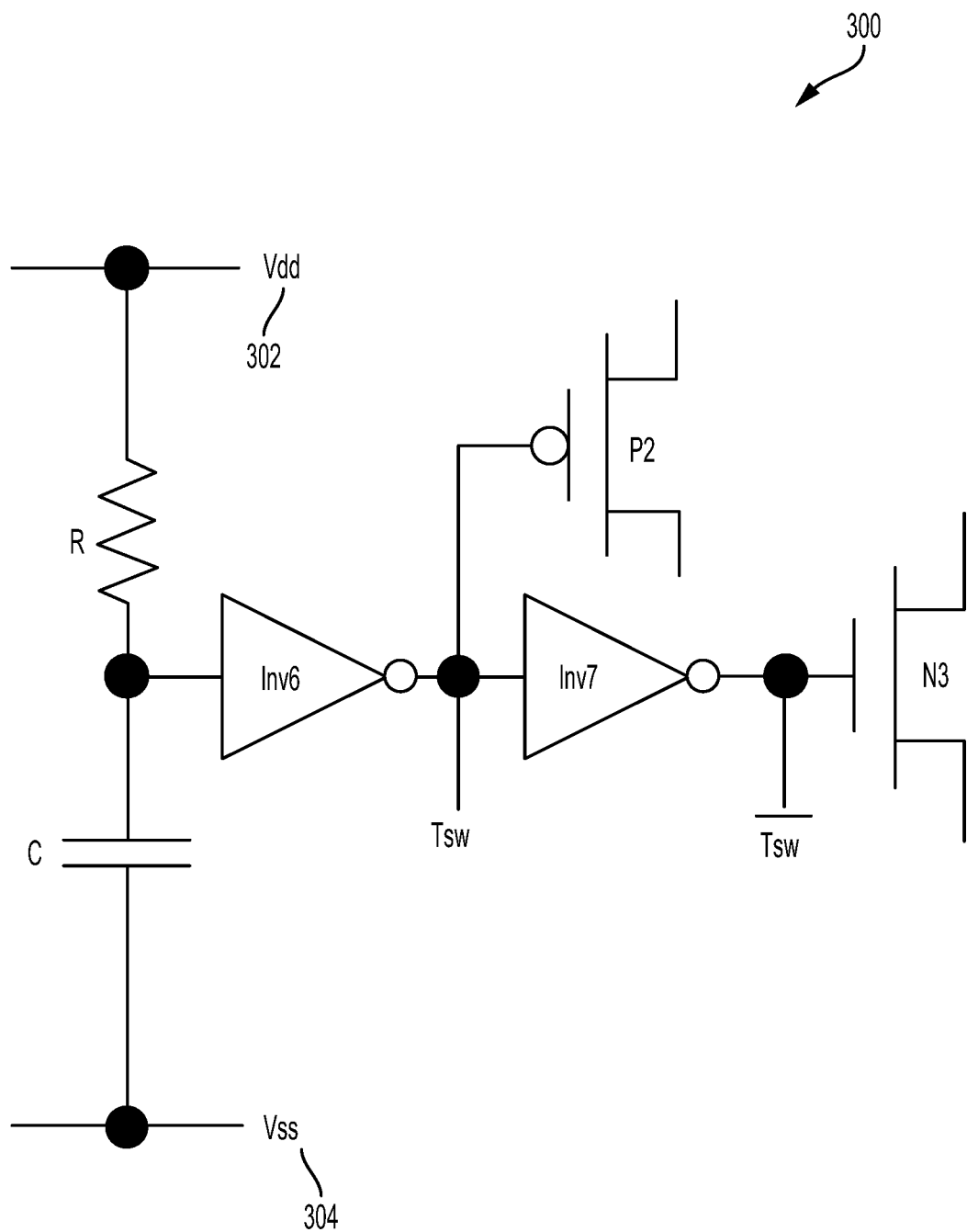
FIG. 3 is a layout diagram of a transient electrostatic discharge (ESD) detector circuit according to an aspect of the present disclosure.

FIG. 1 is a schematic diagram of an ESD protected input/output (I/O) circuit system 100 according to an aspect of the present disclosure. Representatively, an input/output (I/O) driver circuit 120 is selectively coupled to a pre-driver circuit 110 to drive an input pad 106. In this aspect of the present disclosure, switches 140 are arranged between the I/O driver circuit 120, a power supply terminal 102 (Vdd), a ground terminal 104 (Vss), and the pre-driver circuit 110 of the ESD protected I/O circuit system 100. In operation, an ESD detector circuit 130 (e.g., a transient detector) monitors normal operation of the ESD protected I/O circuit system 100. The ESD detector circuit 130 is configured to detect an electrostatic discharge event and prevent the electrostatic discharge event from damaging the I/O driver circuit 120. In one aspect of the present disclosure, the ESD detector circuit 130 may be configured as shown in FIG. 3.

In this aspect of the present disclosure, during a detected electrostatic discharge event, the ESD detector circuit 130 opens the switches 140 using switch control signals 142 (Tsw) to float the nodes that couple to the I/O driver circuit 120 to the rest of the ESD protected I/O circuit system 100. The switch control signals 142 may be logic '0' during a detected electrostatic discharge event and logic 1 during normal operation. Thus, during normal operation, the switches 140 are closed, allowing the I/O driver circuit 120 to function normally. Although this arrangement assumes that logic '1' for the switch control signals 142 closes the switches 140 and logic '0' opens the switches 140, other configurations of the switch control signals 142 are also possible. An ESD detector circuit, for example, as shown in FIG. 3, may assert a switch control signal Tsw to a logic '1' state in response to a detected electrostatic discharge event, and maintain the switch control signal Tsw at a logic '0' state during normal operation.

Figure 4:
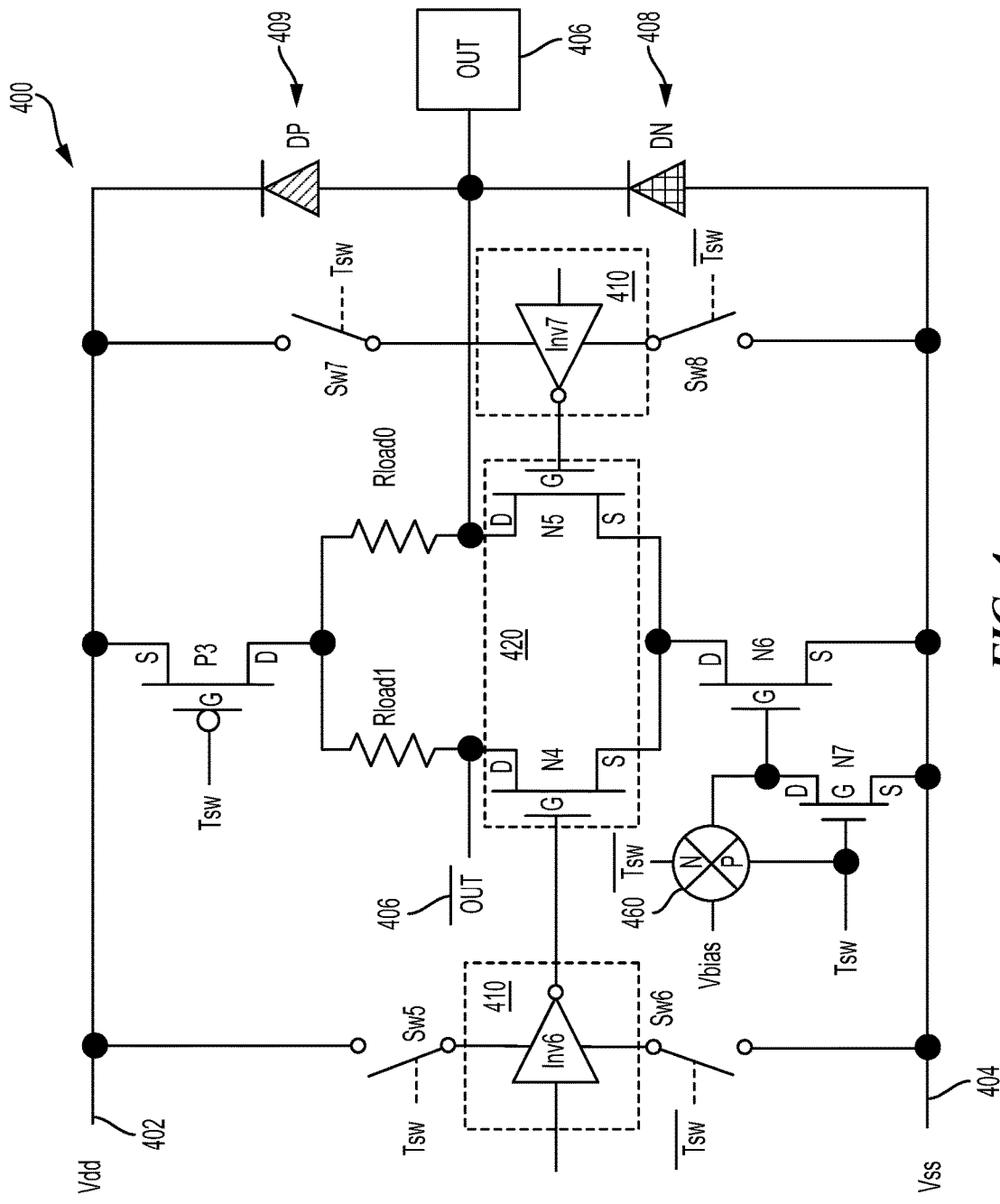
FIG. 4 is a schematic diagram of an electrostatic discharge (ESD) protected serializer/deserializer (SERDES) differential driver circuit, according to an aspect of the present disclosure.
Figure 5:
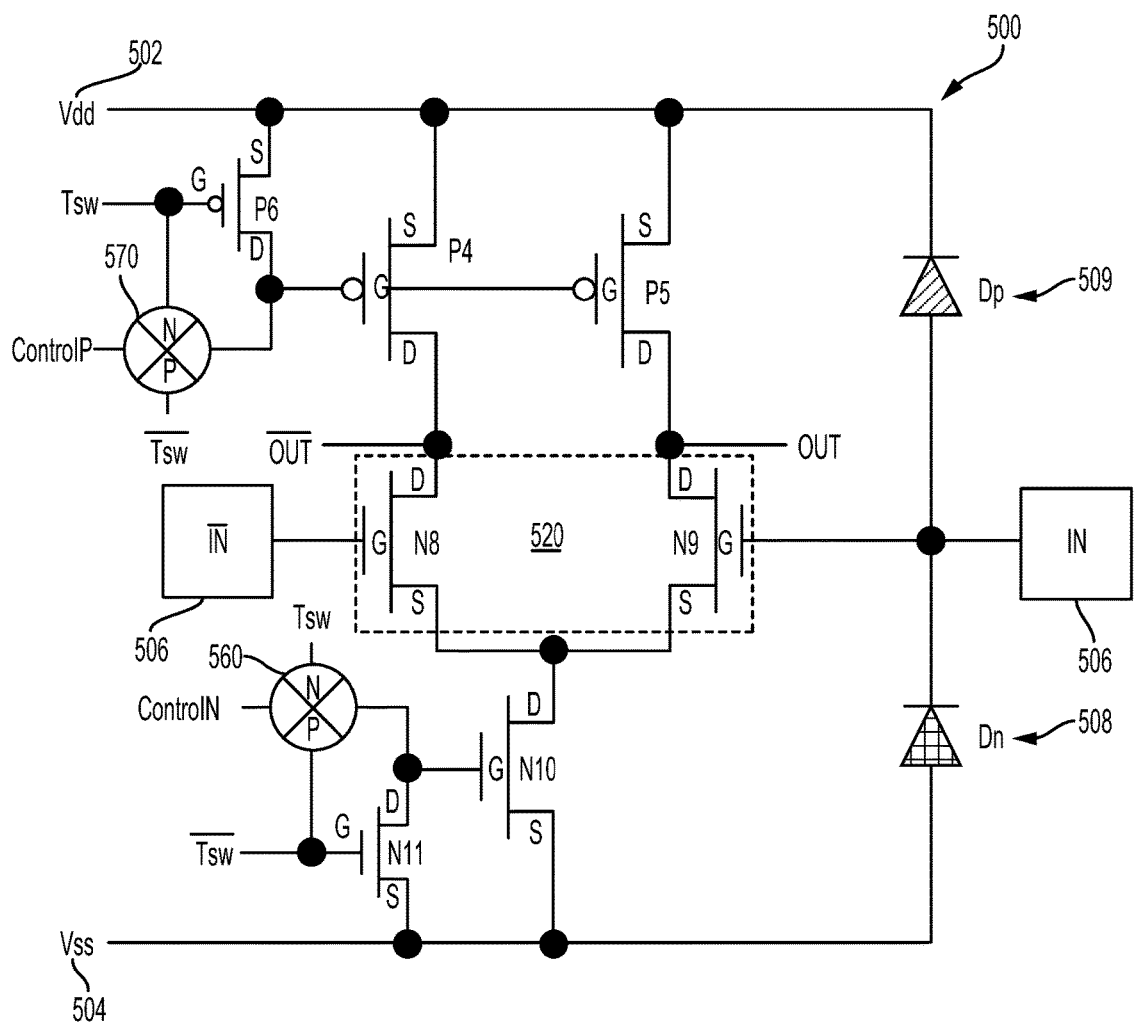
FIG. 5 is a schematic diagram of an electrostatic discharge (ESD) protected serializer/deserializer (SERDES) differential receiver circuit, according to an aspect of the present disclosure.

This aspect of the present disclosure isolates the I/O driver circuit 120 during an electrostatic discharge event using the switches 140. This allows the transistors (e.g., metal oxide semiconductor field effect transistors (MOSFETs)) of the I/O driver circuit 120 to "float," thereby eliminating an I/O circuit discharge path up to the limit of the drain-body failure voltage of the I/O circuit's MOSFETs. The drain-body failure voltage of a MOSFET can be increased by using weak body ties, but using weak body ties should be tempered with the latch-up susceptibility. Aspects of the present disclosure prevent the drain-body failure voltage of I/O driver circuit transistors by providing electrostatic discharge detection for low voltage (LV) I/O circuits, for example, as shown in FIG. 2, as well as serializer/deserializer (SERDES) input and output driver circuits, for example, as shown in FIGS. 4 and 5.

Figure 2:
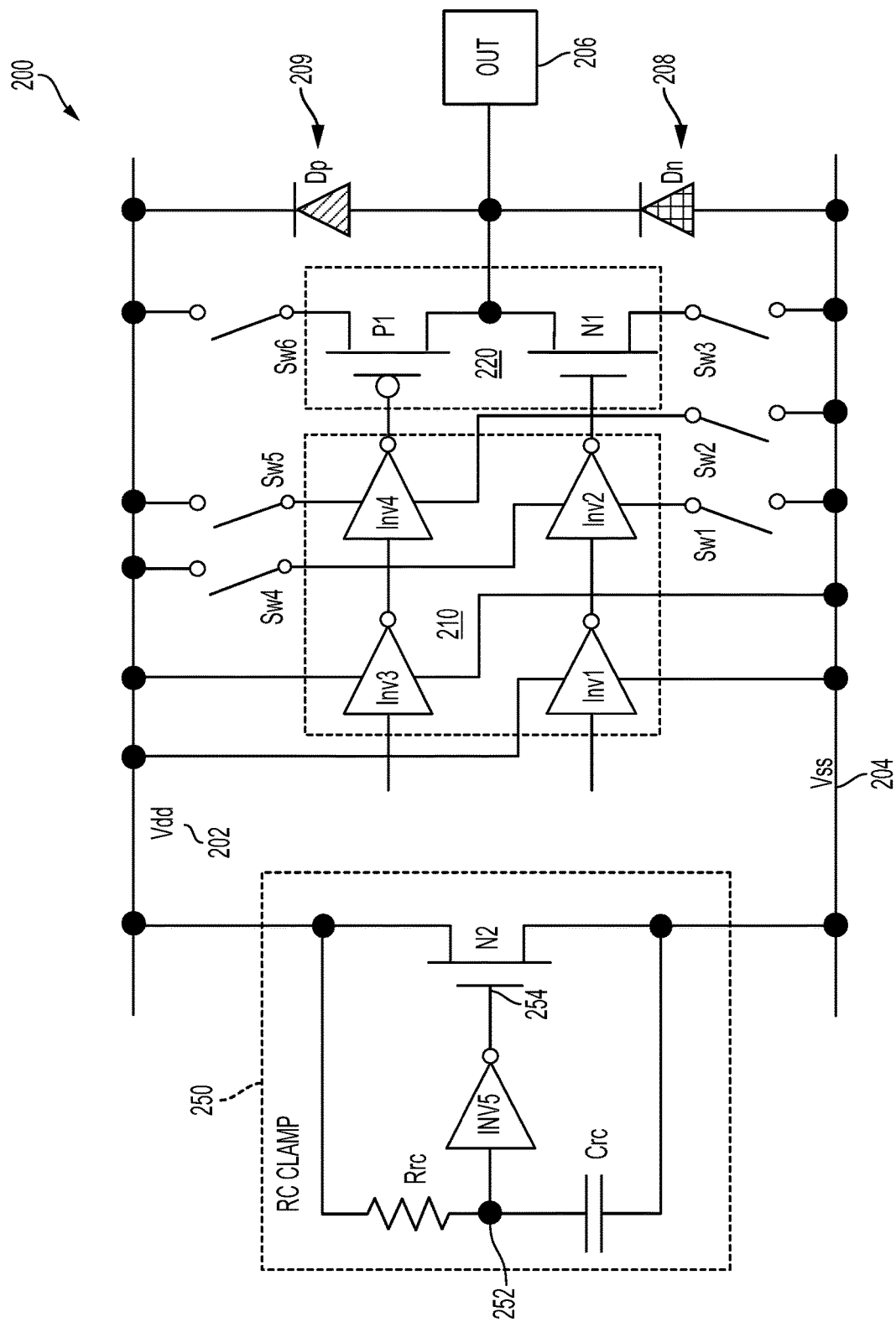
FIG. 2 illustrates an ESD protected low voltage (LV) I/O circuit according to aspects of the present disclosure.

FIG. 2 illustrates an ESD protected low voltage (LV) I/O circuit system 200 according to aspects of the present disclosure. Representatively, the protected I/O circuit system 200 includes an I/O driver circuit 220 coupled to a pre-driver circuit 210. The I/O driver circuit 220 includes low voltage p-type field-effect transistor (PFET) and n-type FET (NFET) drivers that are driven by pre-driver inverters (Inv) of the pre-driver circuit 210. In this arrangement, the n-type transistor driver N1 and the p-type transistor driver P1 of the I/O driver circuit 220 are used to drive an output pad 206 (Out).

In this aspect of the present disclosure, switches are used to float the I/O driver circuit 220 and a portion of the pre-driver circuit 210 to provide ESD protection for the protected I/O circuit system 200. In this arrangement, a power switch Sw6 may be used to turn on/off a connection of the p-type transistor driver P1 to a power supply terminal 202 (Vdd) of the protected I/O circuit system 200. Similarly, a ground switch Sw3 makes or breaks a connection of the n-type transistor driver N1 to a ground terminal 204 (Vss) of the protected I/O circuit system 200. In addition, a pre-driver inverter Inv2 of the pre-driver circuit 210 includes a power switch Sw4 and a ground switch Sw1 to provide ESD protection. Similarly, a pre-driver inverter Inv4 of the pre-driver circuit 210 includes a power switch Sw5 and a ground switch Sw2. In this arrangement, a pre-driver inverter Inv3, coupled to the pre-driver inverter Inv4, and a pre-driver inverter Inv1, coupled to the pre-driver Inv2 of the pre-driver circuit 210, are directly coupled between the ground terminal 204 and the power supply terminal 202.

As further illustrated in FIG. 2, a resistance capacitance (RC) clamp 250 is coupled to the power supply terminal 202 and the ground terminal 204 of the protected I/O circuit system 200. In this arrangement, the RC clamp 250 is enabled by an ESD transient detector, including a resistor Rrc, a capacitor Crc, and an inverter Inv5. During an electrostatic discharge event, the driver transistors (e.g., the n-type transistor driver N1 and the p-type transistor driver P1) are "floated" with respect to the power rails (e.g., 202, 204) and the inputs (e.g., 210). The failure voltage of the n-type transistor driver N1 is now determined by the drain-body junction of the n-type transistor driver N1. In one aspect of the present disclosure, a weaker body tie can increase the failure voltage of the n-type transistor driver N1 by using an N-well ring.

During normal operation, the resistor Rrc keeps an internal node 252 close to the voltage level of the power supply terminal 202 (e.g., Vdd). The internal node 252 triggers the actions of the inverter Inv5. This also keeps a gate node 254 of a shunt transistor N2 at the voltage level of the ground terminal 204, which keeps the transistor N2 off (e.g., non-conducting). As time passes, the resistor Rrc raises the voltage across (also known as "pulling up") a capacitor Crc to the voltage level of the power supply terminal 202. In this configuration, the power supply turn on voltage is much larger than the RC time constant of Rrc and Crc. As a result, N2 remains off during the power up phase. The pulling up of the capacitor Crc to the voltage level Vdd of the power supply terminal 202 changes the voltage of the internal node 252 to a high voltage, which turns on the inverter Inv5. Once the inverter Inv5 is turned on, the voltage of the ground terminal 204 feeds into the gate node 254 of the shunt transistor N2. This shuts off the shunt transistor N2.

Before an electrostatic discharge event, the RC clamp 250 is unpowered so that the charge on the capacitor Crc is zero. During the electrostatic discharge event, electrostatic discharge transients appear on the power supply terminal 202, causing the voltage between the power supply terminal 202 and the ground terminal 204 to rise rapidly (e.g., in a few nanoseconds or less). The capacitor Crc keeps the voltage of the internal node 252 at zero volts, momentarily. The inverter Inv5 outputs a voltage on the gate node 254 at the voltage level of the power supply terminal 202, which turns on the shunt transistor N2.

The shunt transistor N2 is designed to absorb the current flow during electrostatic discharge, which maintains a reduced voltage range between the power supply terminal 202 and the ground terminal 204. The shunt transistor N2 is also known as the electrostatic discharge current shunt transistor because it shunts current caused by electrostatic discharge that flows from the power supply terminal 202 to the ground terminal 204. The shunt transistor N2 operates in conjunction with the shunt path provided by a diode Dp 209 and a diode Dn 208 coupled between the power supply terminal 202, the ground terminal 204 and the driver transistors (e.g., the n-type transistor driver N1 and the p-type transistor driver P1). In one implementation, the resistor Rrc may be a polysilicon resistor. In another implementation, the resistor Rrc may be a transistor (such as a MOSFET) biased as a resistor.

Depending on the failure tolerance of the protected transistor driver (e.g., the n-type transistor driver N1 and the p-type transistor driver P1) and stress condition, not all switches (e.g., Sw2, Sw5, and Sw6) have to be implemented. For example, the worst case discharge for the charged device model (CDM) is typically when current flows into the output pad 206, up through the diode Dp 209 and through the shunt transistor N2 of the RC clamp 250. This discharge polarity stresses the n-type transistor driver N1 more than the p-type transistor driver P1. Furthermore, P channel transistors, such as the p-type transistor driver P1, have higher voltage tolerance than N channel transistors, such as the n-type transistor driver N1. Thus, the ground switch Sw3, the ground switch Sw1, and the power switch Sw4 may be sufficient, while adding the ground switch Sw2, the power switch Sw5 and the power switch Sw6 may not improve the overall voltage tolerance at the output pad 206.

In one aspect of the present disclosure, the power and ground switches (Sw1, Sw2, Sw3, Sw4, Sw5, and Sw6) are implemented using metal oxide semiconductor field effect transistors (MOSFETs). The size of the switch transistors may determine an increase in an amount of output driver resistance of the protected I/O circuit system 200. The size of the switch transistors, however, may be increased because large transistor switches do not negatively affect performance of the protected I/O circuit system 200, other than increasing layout area.

FIG. 3 is a layout diagram of a transient electrostatic discharge (ESD) detector circuit 300 according to an aspect of the present disclosure. Representatively, the transient ESD detector circuit 300 includes a resistor R and a capacitor C. These RC elements, in conjunction with an inverter Inv6, drive a logic '1' state on a switch control signal Tsw when a rapid increase in voltage on a supply terminal 302 (Vdd) occurs. The rapid increase on the supply terminal 302 is identified as an electrostatic discharge (ESD) event, rather than a much slower power up condition during normal operation.

The transient ESD detector circuit 300 also includes an n-type transistor switch N3, coupled to an inverter Inv7, and a p-type transistor switch P2, coupled to an inverter Inv6, which are turned "off" during an electrostatic discharge event, but are in an "on" state during normal operation to drive the switch control signals (Tsw and $\overline{T^1O}$). Alternatively, the transient signal may be pulled off of the output of the inverter Inv5 of the RC clamp 250 of FIG. 2. It should be noted that the n-type transistor switches N3 and a p-type transistor switch P2 can be either low voltage or high voltage metal oxide semiconductor field effect transistors (MOSFETs). In this aspect of the present disclosure, the transient ESD detector circuit 300 asserts the switch control signal Tsw to a logic '1' state in response to a detected electrostatic discharge event, and maintains the switch control signal Tsw at a logic '0' state during normal operation to provide ESD protection for the serializer/deserializer (SERDES) input and output driver circuits, for example, as shown in FIG. 4.

Each RC clamp (such as RC clamp 250 and the transient ESD detector circuit 300 of FIGS. 2 and 3, respectively) has a corresponding RC time constant. The RC clamp 250 and the transient ESD detector circuit 300 may be configured for a human body model or a charged device model. The human body model or charged device model is then used to calculate the RC time constant of the RC clamp. Calculating the RC time constant for the RC clamp may involve the multiplication of the resistors (Rrc and R) with the timing capacitors (Crc and C) to derive a product that becomes the RC time constant value. Usually, the human body model calculates a higher RC time constant value for an RC clamp, which may use larger resistance and capacitance values. The charged device model sets an RC time constant value that is shorter and faster than the RC time constant set by the human body model.

For example, an RC time constant associated with the charged device model discharge is less than or around one nanosecond, whereas another RC time constant associated with the human body model discharge may be around one-hundred fifty (150) nanoseconds or higher. The charged device model also usually has much higher current amplitude than the human body model. The human body model also may dissipate more energy than the charged device model.

Damage to MOSFET devices often occurs in the gate oxide dielectrics, as these areas of the devices are very voltage. The gate dielectric ruptures at high voltages. RC clamp design tends to favor keeping the overall voltage low. Therefore, a tradeoff between time, voltage level and current level is evaluated to derive an effective RC clamp design. According to aspects of the present disclosure, preventing damage to the MOSFET devices is provided for serializer/deserializer (SERDES) input and output driver circuits, for example, as shown in FIGS. 4 and 5.

FIG. 4 is a schematic diagram of an ESD protected serializer/deserializer (SERDES) output driver 400, according to an aspect of the present disclosure. Representatively, the SERDES differential output driver 400 includes an I/O driver circuit 420 coupled to a pre-driver circuit 410 to drive a differential output pad 406. In this aspect of the present disclosure, the I/O driver circuit 420 includes a pair of n-type field-effect transistor (NFET) drivers that are driven by pre-driver inverters (Inv) of the pre-driver circuit 410. In addition, a pair of loads (e.g., Rload0 and Rload1) represents characteristic impedance (e.g., 100 Ohms) of a transmission line coupled to the differential output pad 406.

During an electrostatic discharge event, a shunt path provided by a diode Dp 409 and a diode Dn 408 may be insufficient to protect the gate oxide dielectrics of the pair of NFET drivers of the I/O driver circuit 420. According to aspects of the present disclosure, the SERDES differential output driver 400 is configured to 'float' the pair of NFET drivers of the I/O driver circuit 420 using power and ground switches, as described in further detail below. As described herein, the term 'float' may refer to the disengaging of the pair of NFET drivers of the I/O driver circuit 420 from the power rails and inputs to the I/O driver circuit.

In this arrangement, an n-type transistor driver N4 (e.g., first transistor driver) is used to drive a complementary output ($\overline{2°-}$) of the differential output pad 406. In addition, an n-type transistor driver N5 (e.g., second transistor driver) of the I/O driver circuit 420 is used to drive an output (Out) of the differential output pad 406. A pre-driver inverter Inv6 (e.g., first pre-driver inverter) is coupled to a gate G of the n-type transistor driver N4 to control operation the n-type transistor driver N4. The pre-driver inverter Inv6 is also selectively coupled between a power supply terminal 402 (Vdd) and a ground terminal 404 (Vss) through a power switch Sw5 (e.g., first p-type field effect transistor (PFET) switch) and a ground switch Sw6 (e.g., first n-type field effect transistor (NFET) switch) to protect the n-type transistor driver N4 during an electrostatic discharge event. Similarly, a pre-driver inverter Inv7 (e.g., second pre-driver inverter) is coupled to a gate of the n-type transistor driver N5 to control operation of the n-type transistor driver N5. The pre-driver inverter Inv7 is also selectively coupled between the power supply terminal 402 and the ground terminal 404 through a power switch Sw7 (e.g., second PFET switch) and a ground switch Sw8 (e.g., second NFET switch) to protect the n-type transistor driver N5 during an electrostatic discharge event.

In this implementation, the power switch Sw5 and the power switch Sw7, as well as the ground switch Sw6 and the ground switch Sw8 are configured to disable the pre-driver inverter Inv6 and the pre-driver inverter Inv7 in response to the switch control signal Tsw and a complementary switch control signal $\overline{T^1O}$, respectively. In addition, a p-type switch transistor P3 is used to disengage the power supply terminal 402 from the n-type transistor driver N4 and the n-type transistor driver N5 of the I/O driver circuit 420 during a detected electrostatic discharge event. Similarly, the common mode bias n-type transistor N6 is used to disengage the ground terminal 404 from the n-type transistor receiver N4 and the n-type transistor receiver N5 of the I/O driver circuit 420 during a detected electrostatic discharge event. In this configuration, the switch control signal Tsw is asserted to a logic '1' state in response to a detected electrostatic discharge event. During normal operation, however, the switch control signal Tsw is maintained at logic '0' state.

To disengage the ground terminal 404, a common mode bias n-type transistor N6 is either switched off or switched to the bias voltage (Vbias) node according to a transmission gate 460. During normal operation, the transmission gate feeds the Vbias node voltage to the gate G of the common mode bias n-type transistor N6. Feeding of the Vbias node voltage to the common mode bias n-type transistor N6 pre-biases the common mode bias n-type transistor N6 to expedite a response time if an electrostatic discharge event is detected. In addition, an n-type switch N7 is off in response to deassertion (e.g., logic '0') of the switch control signal Tsw during normal operation.

During an electrostatic discharge event, the transmission gate 460 supplies the complementary switch control signal $\overline{T^1O}$ (e.g., logic '0') to turn off the common mode bias n-type transistor N6. In addition, an n-type switch N7 is turned on in response to assertion of the switch control signal Tsw during the electrostatic discharge event. In this configuration, the n-type switch N7 has a drain D coupled to a gate G of the common mode bias n-type transistor N6, a source S coupled to the ground terminal 404, and a gate G coupled to the switch control signal Tsw. During the electrostatic discharge event, the n-type switch N7 is turned on to ground the gate G of the common mode bias n-type transistor N6 to disengage the ground terminal 404. Because the common mode bias n-type transistor N6 is pre-biased, the common mode bias n-type transistor N6 quickly responds to disengage the ground terminal 404.

In this configuration, the power switches (e.g., Sw5 and Sw7) correspond to PFETs, and the ground switches (e.g., Sw6 and Sw8) correspond to NFETs. As a result, the power switches (e.g., Sw5 and Sw7) are open in response to assertion of switch control signal Tsw (e.g., logic '1'); whereas the ground switches (e.g., Sw6 and Sw8) are open in response to the complementary switch control signal $\overline{T^1O}$ (e.g., logic '0') during an electrostatic discharge event. With this configuration, the ground switches (e.g., Sw6 and Sw8) can be implemented with little circuit overhead, especially if the switch control signal Tsw and the complementary switch control signal $\overline{T^1O}$ are derived from the transient ESD detector circuit 300, as shown in FIG. 3. In this configuration, the p-type switch transistor P3 is optional based on a worst case discharge polarity and the differential load resistors Rload1 and Rload2, which may be in the range of approximately 100 Ohms.

FIG. 5 is a schematic diagram of an ESD protected serializer/deserializer (SERDES) differential receiver 500, according to an aspect of the present disclosure. Representatively, the SERDES differential receiver 500 includes an I/O receiver circuit 520 coupled to a differential input pad 506. In this aspect of the present disclosure, the I/O receiver circuit 520 includes a pair of n-type field effect transistor (NFET) receivers. During an electrostatic discharge event, a shunt path provided by a diode Dp 509 and a diode Dn 508 is insufficient to protect the gate oxide dielectrics of the pair of NFET receivers of the I/O receiver circuit 520.

According to aspects of the present disclosure, the SERDES differential receiver 500 is configured to 'float' the pair of NFET receivers of the I/O receiver circuit 520, as described in further detail below. As described herein, the term 'float' may refer to the disengaging of the pair of NFET receivers of the I/O receiver circuit 520 from the power and ground rails of the SERDES differential receiver 500.

In this arrangement, an n-type transistor receiver N8 (e.g., first transistor receiver) is used to receive a complementary input ($\overline{I}$) of the differential input pad 506. In addition, an n-type transistor receiver N9 (e.g., second transistor receiver) of the I/O receiver circuit 520 is used to receive an input (In) of the differential input pad 506. A complementary differential output ($\overline{2^o-}$) is coupled to a drain D of the n-type transistor receiver N8 to supply the received complementary input ($\overline{I}$) of the differential input pad 506. In addition, a differential output (Out) is coupled to a drain of the n-type transistor receiver N9 to supply the received input (In) of the differential input pad 506.

In this aspect of the present disclosure, a p-type load transistor P4 is coupled between the drain D of the n-type transistor receiver N8 and a power supply terminal 502 (Vdd). In addition, a p-type power transistor P5 is coupled between the drain D of the n-type transistor receiver N9 and the power supply terminal 502. A common mode n-type transistor N11 is also coupled between a source S of both the n-type transistor receiver N8 and the n-type transistor receiver N9, and a ground terminal 504 (Vss). In this arrangement, the common mode n-type transistor N11 may operate as a current mirror for the I/O receiver circuit 520 by maintaining a constant output current.

In this implementation, the p-type load transistor P4 (first load transistor) is used to disengage the power supply terminal 502 from the n-type transistor receiver N8 of the I/O receiver circuit 520 during an electrostatic discharge event. In addition, the p-type load transistor P5 (second load transistor) is used to disengage the power supply terminal 502 from the n-type transistor receiver N9 of the I/O receiver circuit 520 during an electrostatic discharge event. Similarly, the common mode n-type transistor N10 is used to disengage the ground terminal 504 from the n-type transistor receiver N8 and the n-type transistor receiver N9 of the I/O receiver circuit 520 during a detected electrostatic discharge event. In this configuration, the switch control signal Tsw is deasserted to a logic '0' state in response to a detected electrostatic discharge event. During normal operation, however, the switch control signal Tsw is maintained at a logic '1' state.

To disengage the ground terminal 504, the common mode n-type transistor N10 is either switched off or switched to an n-type control signal (ControlN) according to a transmission gate 560. During normal operation, the transmission gate 560 feeds the n-type control signal ControlN to the gate of the common mode n-type transistor N10. During an electrostatic discharge event, the transmission gate 560 feeds the switch control signal Tsw (e.g., logic '0') to turn off the common mode transistor N10. In addition, an n-type switch N11 is turned on in response to the complementary switch control signal $\overline{T^1O}$ (e.g., logic '1'). In this configuration, the n-type switch N11 has a drain D coupled to a gate G of the common mode n-type transistor N10, a source S coupled to the ground terminal 504, and a gate G coupled to the complementary switch control signal $\overline{T^1O}$. In this arrangement, the n-type switch N11 grounds the common mode n-type transistor N10 in response to the complementary switch control signal $\overline{T^1O}$ (e.g., logic '1') by shorting the gate G of the common mode n-type transistor N10 to the ground terminal 504 during a detected electrostatic discharge event.

To disengage the power supply terminal 502, the load p-type transistor P4 and the load p-type transistor P5 are either switched off or switched to a p-type control signal (ControlP) according to a transmission gate 570. During normal operation, the transmission gate 570 feeds the p-type control signal ControlP to a gate G of the load p-type transistor P4 and a gate G of the load p-type transistor P5. For example, feeding ControlP to the load p-type transistor P4 and the load p-type transistor may cause these transistors to float during normal operation.

During an electrostatic discharge event, the transmission gate 570 feeds the complementary switch control signal $\overline{T^1O}$ (e.g., logic '1') to the load p-type transistor P4 and the load p-type transistor P5 for turning off the p-type load transistors. In addition, a p-type switch P6 is turned on in response to the switch control signal Tsw (e.g., logic '0'). In this configuration, the p-type switch P6 has a drain D coupled to the gates of the load p-type transistor P4 and the load p-type transistor P5, a source S coupled to the power supply terminal 502, and a gate G coupled to the switch control signal Tsw. In this arrangement, the n-type switch N8 grounds the load p-type transistor P4 and the load p-type transistor P5 in response to deassertion of the switch control signal Tsw by shorting the gates of the load p-type transistor P4 and the load p-type transistor P5 to the power supply terminal 502 during the detected electrostatic discharge event.

Figure 6:
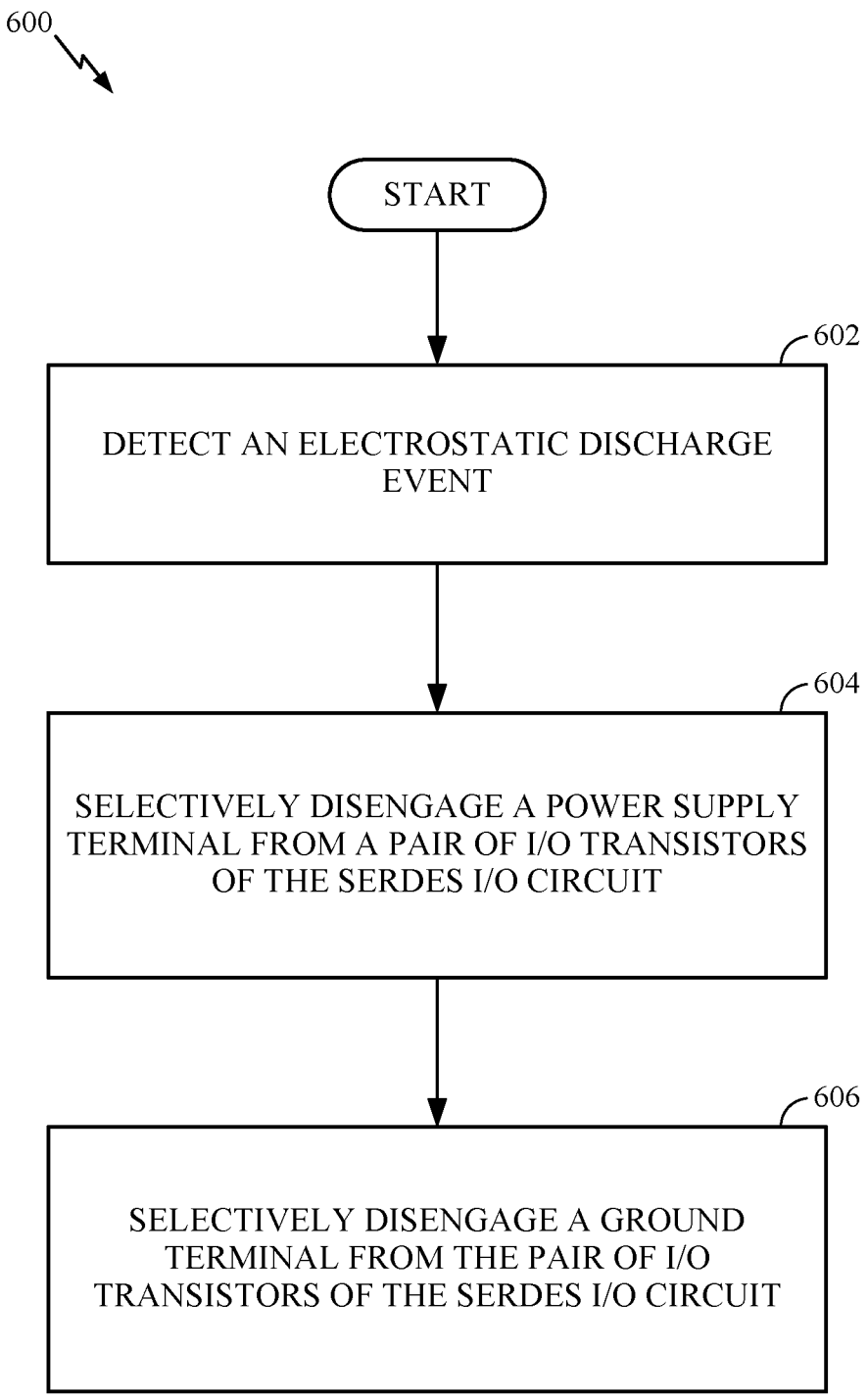
FIG. 6 is a process flow diagram illustrating a method of protecting a serializer/deserializer (SERDES) differential input/output (I/O) circuit according to an aspect of the present disclosure.

FIG. 6 is a process flow diagram illustrating a method 600 of protecting a serializer/deserializer (SERDES) differential input/output (I/O) circuit according to an aspect of the present disclosure. In block 602, an electrostatic discharge event is detected. For example, as shown in FIG. 3, the transient ESD detector circuit 300 may detect an electrostatic discharge event when a rapid increase in voltage on a supply terminal 302 (Vdd) occurs. The rapid increase on the supply terminal 302 is identified as an electrostatic discharge (ESD) event, rather than a much slower power up condition during normal operation.

Referring again to FIG. 6, in block 604, a power supply terminal is selectively disengaged from a pair of I/O transistors of the SERDES I/O circuit. For example, as shown in FIG. 4, a p-type switch transistor P3 is used to disengage the power supply terminal 402 from the n-type transistor driver N4 and the n-type transistor driver N5 of the I/O driver circuit 420 during a detected electrostatic discharge event. As shown in FIG. 5, the p-type load transistor P4 is used to disengage the power supply terminal 502 from the n-type transistor receiver N8 of the I/O receiver circuit 520 during an electrostatic discharge event. In addition, the p-type load transistor P5 is used to disengage the power supply terminal 502 from the n-type transistor receiver N9 of the I/O receiver circuit 520 during an electrostatic discharge event.

Referring again to FIG. 6, in block 606, a ground terminal is selectively disengaged from the pair of I/O transistors of the SERDES I/O driver circuit. For example, as shown in FIG. 4, the common mode bias n-type transistor N6 is used to disengage the ground terminal 404 from the n-type transistor receiver N4 and the n-type transistor receiver N5 of the I/O driver circuit 420 during a detected electrostatic discharge event. As shown in FIG. 5, the common mode n-type transistor N10 is used to disengage the ground terminal 504 from the n-type transistor receiver N8 and the n-type transistor receiver N9 of the I/O receiver circuit 520 during a detected electrostatic discharge event.

According to a further aspect of the present disclosure, serializer/deserializer (SERDES) differential input/output (I/O) circuit is described. The SERDES differential I/O circuit includes means for selectively disengaging the power supply terminal from the first transistor driver and the second transistor driver of the I/O driver circuit. The selectively disengaging means may be the ESD detector circuit 300 of FIG. 3. The SERDES differential I/O circuit further includes means for means for selectively disengaging the ground terminal from the first transistor driver and the second transistor driver of the I/O driver circuit. For example, the selectively disengaging means may be the ESD detector circuit 300 of FIG. 3. In another aspect, the aforementioned means may be any circuit, module, or any apparatus configured to perform the functions recited by the aforementioned means.

Figure 7:
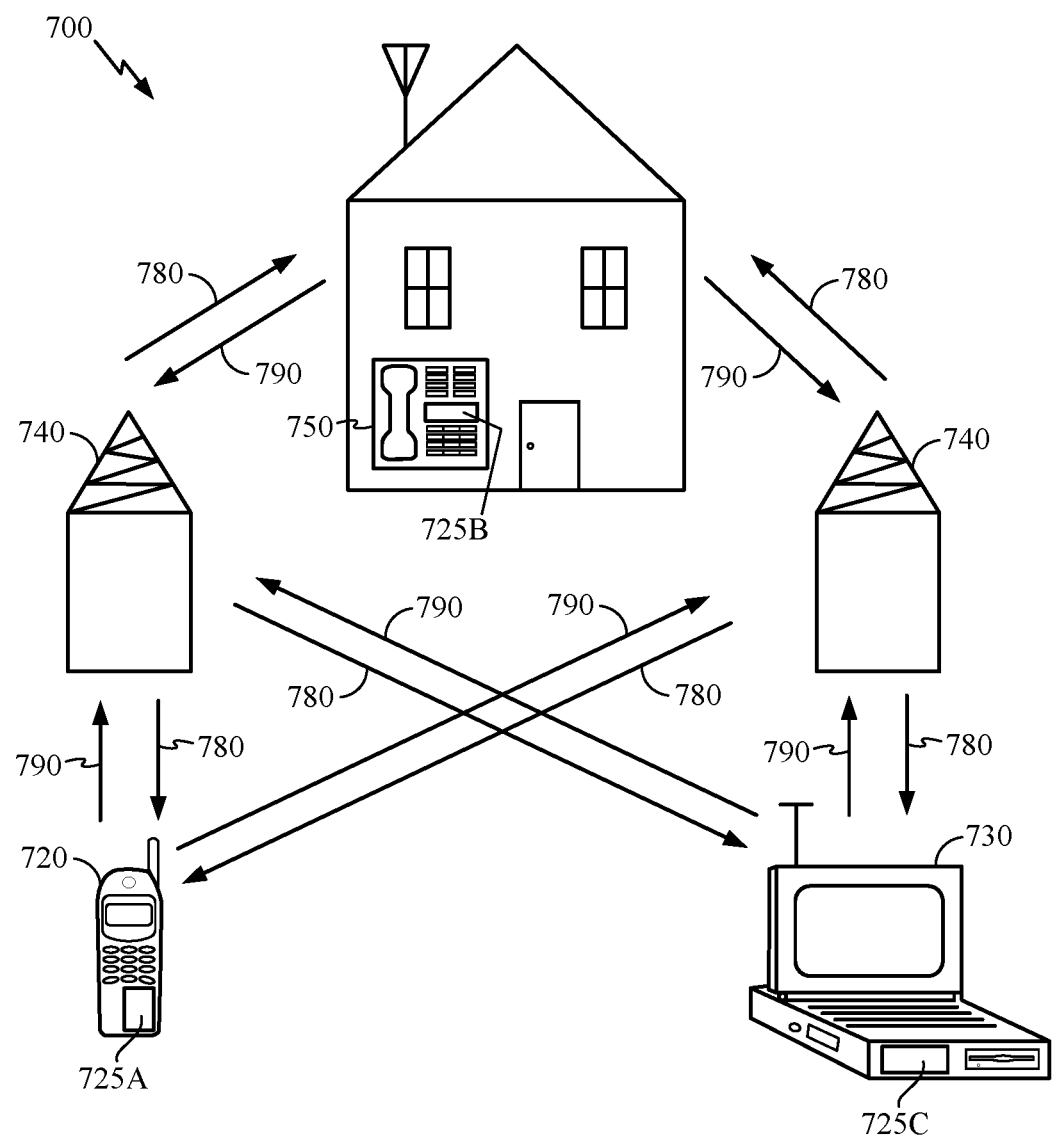
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed ESD protected SERDES I/O circuits. It will be recognized that other devices may also include the disclosed ESD protected SERDES I/O circuits, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, a remote unit may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as a meter reading equipment, a component of the remote unit, such as a display driver, a modem, or other device that stores or retrieves data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed ESD protected SERDES I/O circuits.

Figure 8:
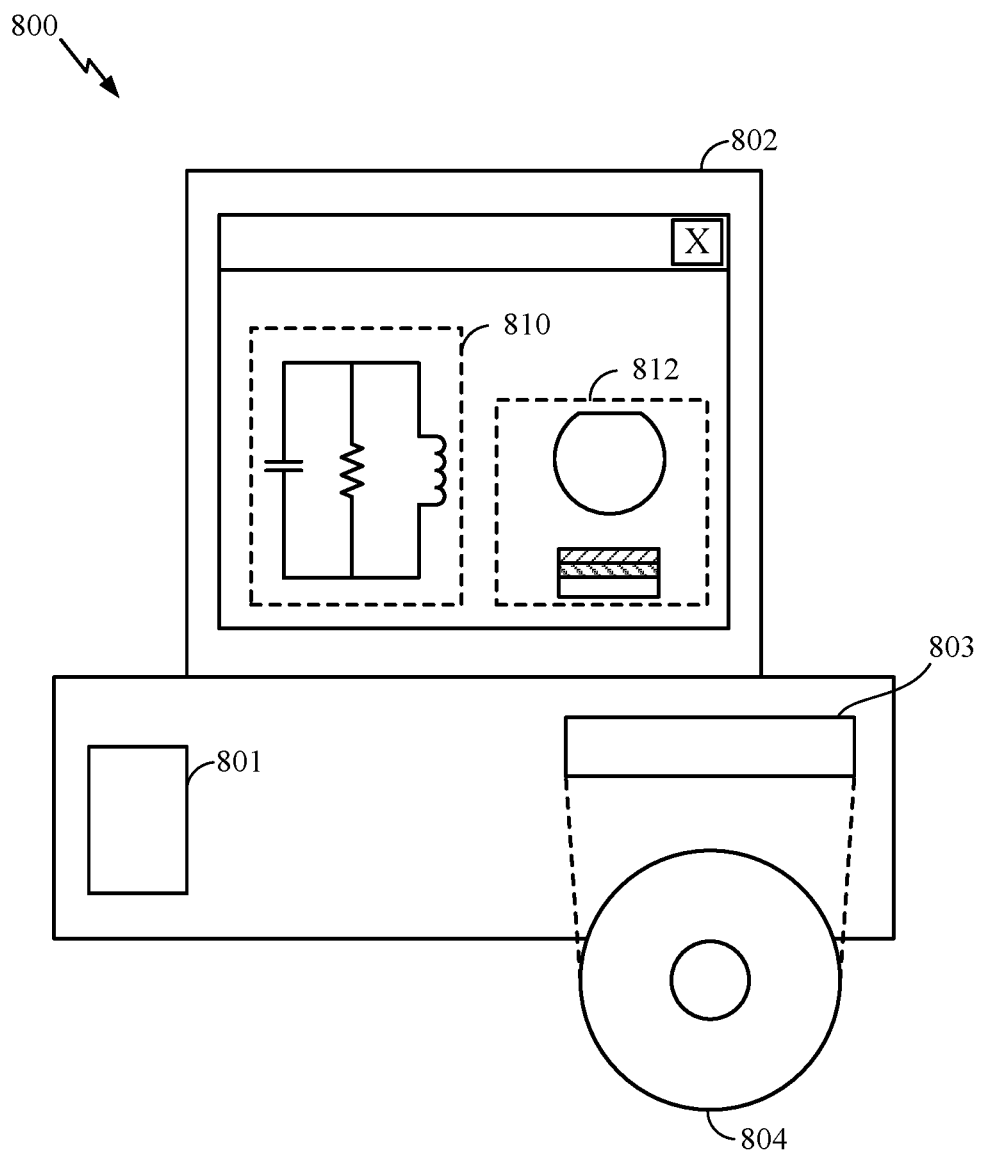
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the ESD protected SERDES I/O circuits disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as an ESD protected I/O driver circuit. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An electrostatic discharge (ESD) protected serializer/deserializer (SERDES) differential driver circuit, comprising:
   an input/output (I/O) driver circuit including a first transistor driver and a second transistor driver, each having a drain coupled to a differential output pad;
   a pre-driver circuit including a first pre-driver inverter coupled to a gate of the first transistor driver, and a second pre-driver inverter coupled to a gate of the second transistor driver, in which the pre-driver circuit is selectively coupled between a power supply terminal and a ground terminal;
   a switch transistor selectively coupled between the power supply terminal, the first transistor driver, and the second transistor driver of the I/O driver circuit;
   a common mode transistor selectively coupled between the ground terminal, the first transistor driver and the second transistor driver of the I/O driver circuit; and
   an ESD detector circuit configured to selectively disengage the power supply terminal from the first transistor driver and the second transistor driver of the I/O driver circuit, and configured to selectively disengage the ground terminal from the first transistor driver and the second transistor driver of the I/O driver circuit.

2. The ESD protected SERDES differential driver circuit of claim 1, further comprising:
   a first p-type field effect transistor (PFET) switch selectively coupling the first pre-driver inverter to the power supply terminal; and
   a second PFET switch selectively coupling the second pre-driver inverter to the power supply terminal, in which the first PFET switch and the second PFET switch are operable to open in response to a switch control signal from the ESD detector circuit.

3. The ESD protected SERDES differential driver circuit of claim 1, further comprising:
   a first n-type field effect transistor (NFET) switch selectively coupling the first pre-driver inverter to the ground terminal; and
   a second NFET switch selectively coupling the second pre-driver inverter to the ground terminal, in which the first NFET switch and the second NFET switch are operable to open in response to a complementary switch control signal from the ESD detector circuit.

4. The ESD protected SERDES differential driver circuit of claim 1, in which the ESD detector circuit further comprises:
- an n-type field effect transistor (NFET) switch, having a drain coupled to a gate of the common mode transistor, a source coupled to the ground terminal, and a gate coupled to a switch control signal from the ESD detector circuit; and
- a transmission gate operable according to the switch control signal to feed a bias voltage to the common mode transistor during normal operation and to feed the complementary switch control signal to the common mode transistor during an electrostatic discharge event.

5. The ESD protected SERDES differential driver circuit of claim 1, in which the first transistor driver and the second transistor driver comprise n-type field effect transistors (NFETs).

6. The ESD protected SERDES differential driver circuit of claim 1, integrated into an I/O circuit system for a modem.

7. The ESD protected SERDES differential driver circuit of claim 1, integrated into an I/O circuit system for a display driver.

8. The ESD protected SERDES differential driver circuit of claim 1, integrated into a mobile phone, a set top box, a music player, a video player, an entertainment unit, a navigation device, a computer, a hand-held personal communication systems (PCS) unit, a portable data unit, and/or a fixed location data unit.

9. An electrostatic discharge (ESD) protected serializer/deserializer (SERDES) differential receiver circuit, comprising:
- an input/output (I/O) receiver circuit including a first transistor receiver and a second transistor receiver, each have having a gate coupled to a differential input pad, and a drain coupled to an internal differential output;
- a first load transistor selectively coupled between a power supply terminal and the first transistor receiver, and a second load transistor selectively coupled between the power supply terminal and the second transistor receiver of the I/O receiver circuit;
- a common mode transistor selectively coupled between a ground terminal, the first transistor receiver and the second transistor receiver of the I/O receiver circuit; and
- an ESD detector circuit configured to selectively disengage the power supply terminal from the first transistor receiver and the second transistor receiver of the I/O receiver circuit, and configured to selectively disengage the ground terminal from the first transistor receiver and the second transistor receiver of the I/O receiver circuit.

10. The ESD protected SERDES differential receiver circuit of claim 9, in which the ESD detector circuit further comprises:
- an n-type field effect transistor (NFET) switch, having a drain coupled to a gate of the common mode transistor, a source coupled to the ground terminal, and a gate coupled to a complementary switch control signal from the ESD detector circuit; and
- a transmission gate operable according to the complementary switch control signal to feed an n-type control signal to the common mode transistor during normal operation and to feed the switch control signal to the common mode transistor during an electrostatic discharge event.

11. The ESD protected SERDES differential receiver circuit of claim 9, in which the ESD detector circuit further comprises:
- a p-type field effect transistor (PFET) switch, having a drain coupled to a gate of the first load transistor and a gate of the second load transistor, a source coupled to the power terminal, and a gate coupled to a switch control signal from the ESD detector circuit; and
- a transmission gate operable according to the switch control signal to feed a p-type control signal to the first load transistor and the second load transistor during normal operation and to feed the complementary switch control signal to the first load transistor and the second load transistor during an electrostatic discharge event.

12. The ESD protected SERDES differential receiver circuit of claim 9, in which the first transistor receiver and the second transistor receiver comprise n-type field effect transistors (NFETs).

13. The ESD protected SERDES differential receiver circuit of claim 9, integrated into an I/O circuit system of a modem.

14. The ESD protected SERDES differential receiver circuit of claim 9, integrated into an I/O circuit system of a display driver.

15. The ESD protected SERDES differential receiver circuit of claim 9, integrated into a mobile phone, a set top box, a music player, a video player, an entertainment unit, a navigation device, a computer, a hand-held personal communication systems (PCS) unit, a portable data unit, and/or a fixed location data unit.

16. A method of protecting a serializer/deserializer (SERDES) differential input/output (I/O) circuit, comprising:
- detecting an electrostatic discharge event;
- selectively disengaging a power supply terminal from a pair of I/O transistors of the SERDES differential I/O circuit in response to the detected electrostatic discharge event;
- selectively disengaging a ground terminal from the pair of I/O transistors of the SERDES differential I/O circuit in response to the detected electrostatic discharge event; and
- controlling the pair of I/O transistors of the SERDES differential I/O circuit by a pre-driver circuit including a first pre-driver inverter and a second pre-driver inverter, in which the pre-driver circuit is selectively coupled between the power supply terminal and the ground terminal.

17. The method of claim 16, further comprising integrating the SERDES differential I/O circuit into a mobile phone, a set top box, a music player, a video player, an entertainment unit, a navigation device, a computer, a hand-held personal communication systems (PCS) unit, a portable data unit, and/or a fixed location data unit.

18. An electrostatic discharge (ESD) protected serializer/deserializer (SERDES) differential driver circuit, comprising:
- an input/output (I/O) driver circuit including a first transistor driver and a second transistor driver, each having a drain coupled to a differential output pad;
- a pre-driver circuit including a first pre-driver inverter coupled to a gate of the first transistor driver, and a second pre-driver inverter coupled to a gate of the second transistor driver, in which the pre-driver circuit is selectively coupled between a power supply terminal and a ground terminal;

a switch transistor selectively coupled between the power supply terminal, the first transistor driver, and the second transistor driver of the I/O driver circuit;

a common mode transistor selectively coupled between the ground terminal, the first transistor driver and the second transistor driver of the I/O driver circuit; and means for selectively disengaging the power supply terminal from the first transistor driver and the second transistor driver of the I/O driver circuit, and means for selectively disengaging the ground terminal from the first transistor driver and the second transistor driver of the I/O driver circuit.

19. The ESD protected SERDES differential driver circuit of claim 18, further comprising:

a first p-type field effect transistor (PFET) switch selectively coupling the first pre-driver inverter to the power supply terminal; and a second PFET switch selectively coupling the second pre-driver inverter to the power supply terminal, in which the first PFET switch and the second PFET switch are operable to open in response to a switch control signal.

20. The ESD protected SERDES differential driver circuit of claim 18, further comprising:

a first n-type field effect transistor (NFET) switch selectively coupling the first pre-driver inverter to the ground terminal; and a second NFET switch selectively coupling the second pre-driver inverter to the ground terminal, in which the first NFET switch and the second NFET switch are operable to open in response to a complementary switch control signal.

21. The ESD protected SERDES differential driver circuit of claim 18, in which the first transistor driver and the second transistor driver comprise n-type field effect transistors (NFETs).

22. The ESD protected SERDES differential driver circuit of claim 18, integrated into an I/O circuit system for a modem.

23. The ESD protected SERDES differential driver circuit of claim 18, integrated into an I/O circuit system for a display driver.

24. The ESD protected SERDES differential driver circuit of claim 18, integrated into a mobile phone, a set top box, a music player, a video player, an entertainment unit, a navigation device, a computer, a hand-held personal communication systems (PCS) unit, a portable data unit, and/or a fixed location data unit.

* * * * *